(12) United States Patent
Muralidharan et al.

(10) Patent No.: US 9,825,596 B2
(45) Date of Patent: Nov. 21, 2017

(54) SWITCHED AMPLIFIERS

(71) Applicant: ANALOG DEVICES, INC, Norwood, MA (US)

(72) Inventors: Sriram Muralidharan, Beaverton, OR (US); Christopher E. Hay, Colorado Springs, CO (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/005,486

(22) Filed: Jan. 25, 2016

(65) Prior Publication Data

US 2017/0214372 A1    Jul. 27, 2017

(51) Int. Cl.
| H03F 1/14 | (2006.01) |
| H03F 1/56 | (2006.01) |
| H03F 3/217 | (2006.01) |
| H03F 3/19 | (2006.01) |

(52) U.S. Cl.
CPC ............... *H03F 1/56* (2013.01); *H03F 3/19* (2013.01); *H03F 3/217* (2013.01); *H03F 2200/222* (2013.01); *H03F 2200/387* (2013.01); *H03F 2200/451* (2013.01)

(58) Field of Classification Search
USPC .................................. 330/51, 295, 302, 311
See application file for complete search history.

(56) References Cited

U.S. PATENT DOCUMENTS

| 5,548,248 | A | 8/1996 | Wang | |
| 5,661,434 | A | 8/1997 | Brozovich et al. | |
| 6,191,656 | B1 | 2/2001 | Nadler | |
| 7,248,111 | B1 | 7/2007 | Xu et al. | |
| 7,598,804 | B2 * | 10/2009 | Suzuki | H03F 3/193 330/295 |
| 8,324,964 | B2 * | 12/2012 | Retz | H03F 1/0277 330/124 R |
| 2005/0079836 | A1 * | 4/2005 | Behzad | H03F 1/223 455/127.1 |
| 2006/0208796 | A1 * | 9/2006 | Nellis | H03F 1/0205 330/133 |
| 2012/0161878 | A1 * | 6/2012 | Joly | H03F 1/0211 330/296 |
| 2012/0188011 | A1 | 7/2012 | Retz et al. | |
| 2013/0079065 | A1 | 3/2013 | Jo et al. | |

* cited by examiner

*Primary Examiner* — Steven J Mottola
(74) *Attorney, Agent, or Firm* — Patent Capital Group

(57) ABSTRACT

Various embodiments of switched amplifiers are disclosed herein. In some embodiments, a switched amplifier may include a first amplifier; a second amplifier; an input matching network common to both the first and second amplifiers; and at least one switch to couple an input of the switched amplifier, via the input matching network, to one of the first amplifier or the second amplifier. In some embodiments, a switched amplifier may include a first amplifier; a second amplifier; an input matching network common to both the first and second amplifiers or an output matching network common to both the first and second amplifiers; and a bias generation circuit to selectively (1) provide a first bias current to the first amplifier or (2) provide a second bias current to the second amplifier, wherein the second bias current is less than the first bias current.

25 Claims, 8 Drawing Sheets

SWITCHED AMPLIFIERS

TECHNICAL FIELD

The present disclosure relates generally to the field of electronic amplifiers, and more particularly, to switched amplifiers.

BACKGROUND

Many conventional electronic amplifiers are constrained to operate in a narrow range of bias currents in order to provide adequately constant gain over different input signals and operating conditions. Attempting to operate a conventional amplifier at lower bias currents may result in distortion, saturation, or device failure.

BRIEF DESCRIPTION OF THE DRAWINGS

Embodiments will be readily understood by the following detailed description in conjunction with the accompanying drawings. Embodiments are illustrated by way of example, and not by way of limitation, in the figures of the accompanying drawings.

DETAILED DESCRIPTION

Various embodiments of switched amplifiers are disclosed herein, along with related systems, devices, and methods. In some embodiments, a switched amplifier may include a first amplifier; a second amplifier; an input matching network common to both the first and second amplifiers; and at least one switch to couple an input of the switched amplifier, via the input matching network, to one of the first amplifier or the second amplifier. In some embodiments, a switched amplifier may include a first amplifier; a second amplifier; an input matching network common to both the first and second amplifiers, or an output matching network common to both the first and second amplifiers; and a bias generation circuit to selectively (1) provide a first bias current to the first amplifier or (2) provide a second bias current to the second amplifier, wherein the second bias current is less than the first bias current. In particular, various ones of the embodiments disclosed herein may provide an amplifier configuration that is able to operate with near peak performance under a wide range of bias currents and input signals.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Figure 1:
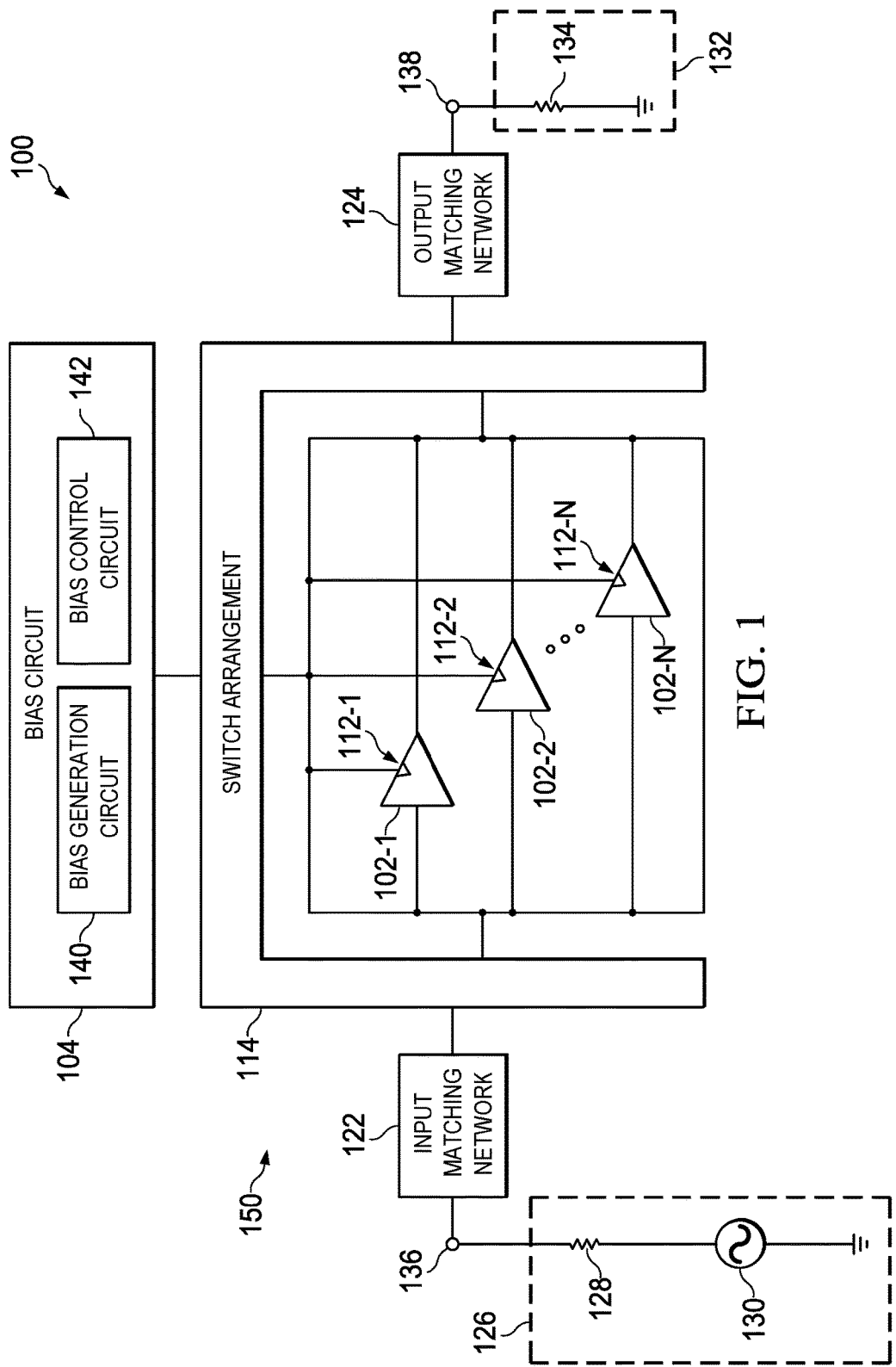
FIG. 1 is a block diagram of a switched amplifier system, in accordance with various embodiments.

FIG. 1 is a block diagram of a switched amplifier system 100, in accordance with various embodiments. The switched amplifier system 100 may include a switched amplifier 150 having an input terminal 136 coupled to an input source 126, and having an output terminal 138 coupled to an output load 132. The input source 126 may be modeled as a voltage source 130 in series with a source impedance 128, and the input terminal 136 may be coupled to an input matching network 122, as illustrated. The input matching network 122 may include an arrangement of passive components (e.g., resistors, capacitors, and/or inductors) to improve the impedance matching between the input source 126 and the switched amplifier 150 at the input terminal 136 and thereby improve the power transfer efficiency between the input source 126 and the switched amplifier 150. In some embodiments, the input source 126 may be a radiofrequency (RF) source.

The output load 132 may be modeled as a load impedance 134, and the output terminal 138 may be coupled to an output matching network 124, as illustrated. The output matching network 124 may include an arrangement of passive components to improve the impedance matching between the output load 132 and the switched amplifier 150 at the output terminal 138, and thereby improve the power transfer efficiency between the switched amplifier 150 and the output load 132.

The switched amplifier 150 may include two or more amplifiers 102. In FIG. 1, amplifiers 102-1, 102-2, ..., 102-N are illustrated. In some embodiments, the amplifiers 102 may be transconductance amplifiers. The amplifiers 102 may be coupled to the input matching network 122, the output matching network 124, and a bias circuit 104 via a switch arrangement 114. The switch arrangement 114 may include one or more switches to selectively include different ones of the amplifiers 102 in the signaling pathway between the input terminal 136 and the output terminal 138. For example, the switch arrangement 114 may include at least one switch to couple the input terminal 136 of the switched amplifier 150 to one of the amplifiers 102 (via the input matching network 122). In another example, the switch arrangement 114 may include at least one switch to couple the output terminal 138 of the switched amplifier 150 to one of the amplifiers 102 (via the output matching network 124).

In some embodiments, the switched amplifier 150 may include a single input matching network 122 that is common to multiple different ones of the amplifiers 102 as they are switched in and out of the signaling pathway between the input terminal 136 and the output terminal 138. In some such embodiments, the switched amplifier 150 may include a single output matching network 124 that is common to multiple different ones of the amplifiers 102 (as illustrated in FIG. 1), or different output matching networks for different ones of the amplifiers 102 (not illustrated). In some embodiments, the switched amplifier 150 may include a single output matching network 124 that is common to multiple different ones of the amplifiers 102 as they are switched in and out of the signaling pathway between the input terminal 136 and the output terminal 138, and different input matching networks for different ones of the amplifiers 102 (not illustrated).

By having multiple ones of the amplifiers 102 share the input matching network 122 and/or the output matching network 124, the switched amplifier 150 may have an advantageously small footprint compared with a configuration in which each amplifier 102 has its own input matching network and output matching network. The passive components included in the input and output matching networks in an amplifier typically require a significant amount of device "real estate"; inductors and capacitors, for example, occupy much more area on a chip than transistors. By sharing the input matching network 122 and/or the output matching network 124, significant on-chip area may be conserved, at the cost of potentially imperfect matching (e.g., because the different amplifiers 102 present different impedance characteristics). In some embodiments, the input matching network 122 may be selected to represent a "midpoint" or other compromise point between the "ideal" input matching networks for each of the amplifiers 102; similarly, the output matching network 124 may be selected to represent a midpoint or other compromise point between the ideal output matching networks for each of the amplifiers 102.

In some embodiments, the switch arrangement 114 may include a fixed coupling between the input matching network 122 and the inputs of each of the different amplifiers 102, regardless of which of the amplifiers 102 is included in the signaling pathway between the input terminal 136 and the output terminal 138. For example, the input matching network 122 may be coupled to each of the different amplifiers 102 with different continuous conductive traces, and the switch arrangement 114 may include switches disposed between the outputs of the different amplifiers 102 and the output matching network 124 to include different ones of the amplifiers 102 in the signaling pathway between the input terminal 136 and the output terminal 138. Conversely, in some embodiments, the switch arrangement 114 may include a fixed coupling between the output matching network 124 and the outputs of each of the different amplifiers 102, regardless of which of the amplifier 102 is included in the signaling pathway between the input terminal 136 and the output terminal 138. For example, the output matching network 124 may be coupled to each of the different amplifiers 102 with different continuous conductive traces, and the switch arrangement 114 may include switches disposed between the inputs of the different amplifiers 102 and the input matching network 122 to include different ones of the amplifier 102 and the signaling pathway between the input terminal 136 and the output terminal 138.

The switch arrangement 114 may also include one or more switches to selectively provide different bias currents to respective bias inputs 112 of the respective amplifiers 102 from the bias circuit 104 (e.g., bias input 112-1 associated with amplifier 102-1, bias input 112-N associated with amplifier 102-N, etc.). For example, when the amplifier 102-1 is included in the signaling pathway between the input terminal 136 and the output terminal 138, the bias circuit 104 may provide a bias current to the bias input 112-1 of the amplifier 102-1 to bias the amplifier 102-1 into its proper regime of operation. If the amplifier 102-2 is included in the signaling pathway between the input terminal 136 and the output terminal 138, the bias circuit 104 may provide a bias current to the bias input 112-2 of the amplifier 102-2 to bias the amplifier 102-2 into its proper regime of operation.

In some embodiments, the bias circuit 104 may include a bias generation circuit 140 and a bias control circuit 142. The bias control circuit 142 may be configured to receive a signal representative of a desired power mode and/or bias level, determine an amount of bias current to be provided based on the received signal, and provide a signal indicative of that bias current to the bias generation circuit 140. The bias generation circuit 140 may be configured to receive the signal indicative of the bias current and generate a bias current accordingly for provision to an amplifier 102. Examples of power modes and bias levels are discussed in further detail below with reference to FIG. 8.

The bias control circuit 142 may cause the actuation of one or more switches in the switch arrangement 114 based on the desired power mode and/or bias level. In some embodiments, the bias control circuit 142 may cause different ones of the switches in the switch arrangement 114 to be actuated to include different ones of the amplifiers 102 in the signaling pathway between the input terminal 136 and the output terminal 138. For example, the amplifier 102-1 may correspond to a low-power mode, the amplifier 102-2 may correspond to a medium-power mode, and the amplifier 102-N may correspond to a high-power mode; in such an embodiment, the bias control circuit 142 may cause one or more switches in the switch arrangement 114 to insert the amplifier 102-1 (respectively, amplifier 102-2, and amplifier 102-N) in the signaling pathway between the input terminal 136 and the output terminal 138 in response to receipt of a low- (respectively, medium- and high-) power mode signal.

In some embodiments, the bias control circuit 142 may cause different ones of the switches and the switch arrangement 114 to be actuated to route bias current to different ones of the amplifiers 102. In particular, the bias control circuit 142 may cause bias current to be routed to a particular amplifier 102 when that amplifier 102 is included in a signaling pathway between the input terminal 136 and the output terminal 138. For example, when switches in the switch arrangement 114 are arranged to include the amplifier 102-1 in the signaling pathway between the input terminal 136 and the output terminal 138, the bias control circuit 142 may cause switches in the switch arrangement 114 to provide a pathway for bias current between the bias generation circuit 140 and the bias input 112-1. When switches in the switch arrangement 114 are arranged to include the amplifier 102-2 in the signaling pathway between the input terminal 136 and the output terminal 138, the bias control circuit 142 may cause switches in the switch arrangement 114 to provide a pathway for bias current between the bias generation circuit 140 and the bias input 112-2.

As indicated above, different ones of the amplifiers 102 may be provided with different amounts of bias current for proper operation. For example, the amplifier 102-1 may be provided with a bias current that is less than a bias current provided to the amplifier 102-2. In some embodiments, different ones of the amplifiers 102 may be suitable for use when the switched amplifier 150 has different power constraints. For example, a nominal bias current amplifier 102 (e.g., amplifier 102-2) may be included in the signaling pathway between the input terminal 136 and the output terminal 138 during nominal (e.g., "normal") operation, and a lower bias current amplifier 102 (e.g., the amplifier 102-1) may be included in the signaling pathway between the input terminal 136 and the output terminal 138 during periods in which the power consumption of the switched amplifier 150 is to be reduced below its nominal value.

Figure 2:
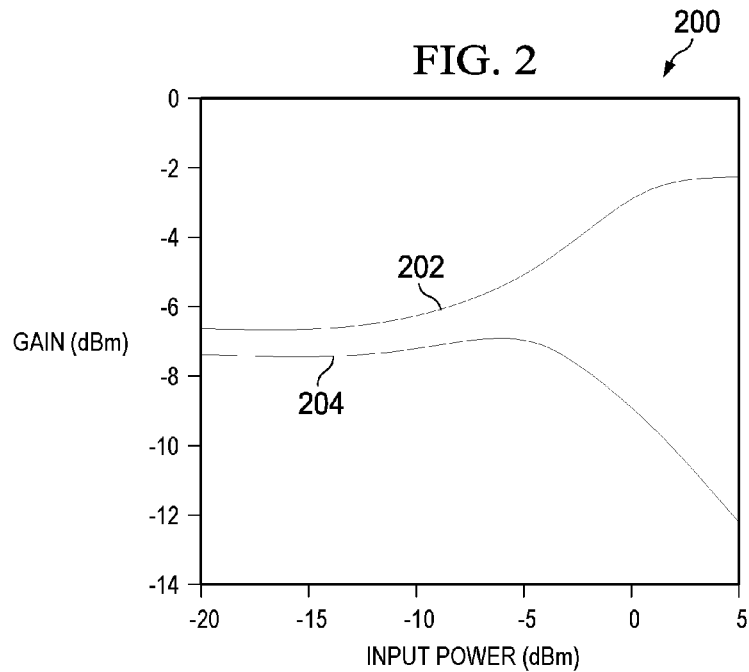
FIG. 2 is a plot depicting example gain versus input power curves, at a fixed low bias current, for different amplifiers that may be included in the switched amplifier system of FIG. 1, in accordance with various embodiments.

Using different ones of the amplifiers 102 when different bias currents are available (e.g., due to different power constraints) may mitigate the gain expansion that occurs in conventional amplifiers at low bias currents. When a conventional amplifier is "optimally" biased to operate near its unity gain current frequency, the amplifier is able to achieve its maximum gain. However, when the bias current provided to a conventional amplifier is reduced below the "optimal" value (e.g., due to power constraints), the amplifier exhibits increases in gain with increases in the amplitude of the input voltage (referred to as "gain expansion"), and thus no longer exhibits constant gain. In some embodiments of the switched amplifiers 150 disclosed herein, different ones of the amplifiers 102 may be designed to perform well (e.g., provide adequately constant gain) at different bias currents so that when the available bias current changes (e.g., due to power constraint changes), the corresponding "best" amplifier 102 for that available bias current may be included in the signaling pathway between the input terminal 136 and the output terminal 138. For example, FIG. 2 is a plot 200 depicting example gain versus input power curves, at a fixed low bias current, for different amplifiers that may be included in the switched amplifier system 100 of FIG. 1, in accordance with various embodiments. In particular, the curve 202 may represent the gain versus input power for a "large" amplifier 102, and the curve 204 may represent the gain versus input power for a "small" amplifier 102, when each are biased at the same low bias current. The "large" amplifier may have a larger length and/or width than the "small" amplifier. For example, the "large" amplifier associated with the curve 202 may include four parallel transistors, each having a width of 0.2 µm and a length of 4 µm, while the "small" amplifier associated with the curve 204 may include a single transistor having a width of 0.2 µm and a length of 4 µm. In such an embodiment, the low bias current underlying both curves 202 and 204 may be approximately 2 mA. The particular numeric values and curve shapes of FIG. 2 are simply illustrative, and the principles discussed herein with reference to FIG. 2 may be usefully applied to any suitable amplifiers that may be included in the switched amplifier 150.

As shown in the plot 200, as the input power increases, the gain of the "large" amplifier 102 associated with the curve 202 increases significantly as the input power increases. This may result in the unintended saturation of circuits further down the signaling pathway, and/or may provide a false picture at the output of the actual magnitude of the input (since the gain at higher powers differs significantly from the gain at lower powers). For the "small" amplifier associated with the curve 204, although the gain at all input powers is less than the "large" amplifier, as the input power increases, the gain increases slightly and then decreases slightly (i.e., exhibiting slight "gain reduction"). These slight expansions and reduction in gain represented by the curve 204 may be tolerable in many applications in which the significant gain expansion of the curve 202 is not. Thus, at low bias currents, the switched amplifier 150 may "activate" an amplifier 102 like the "small" amplifier associated with the curve 204 (to achieve more constant gain at the expense of lower overall gain), and may activate an amplifier 102 like the "large" amplifier associated with the curve 202 at higher bias currents. For example, the amplifier 102-1 of the switched amplifier 150 may be a "large" amplifier (used for nominal-power applications), and the amplifier 102-2 may be a "small" amplifier (used for low-power applications). More generally, the switched amplifier 150 may include two or more amplifiers 102, each designed to operate with substantially constant gain at a particular bias current, and the switched amplifier 150 may "switch" between these amplifiers 102 as the bias current changes (e.g., in response to power constraints).

The switched amplifier 150 of FIG. 1 may be implemented in any suitable manner. For example, FIGS. 3-6 are schematic illustrations of various example embodiments of the switched amplifier 150, in which different ones of the amplifiers 102 are transconductance amplifiers. Each of FIGS. 3-6 will now be discussed in turn.

Figure 3:
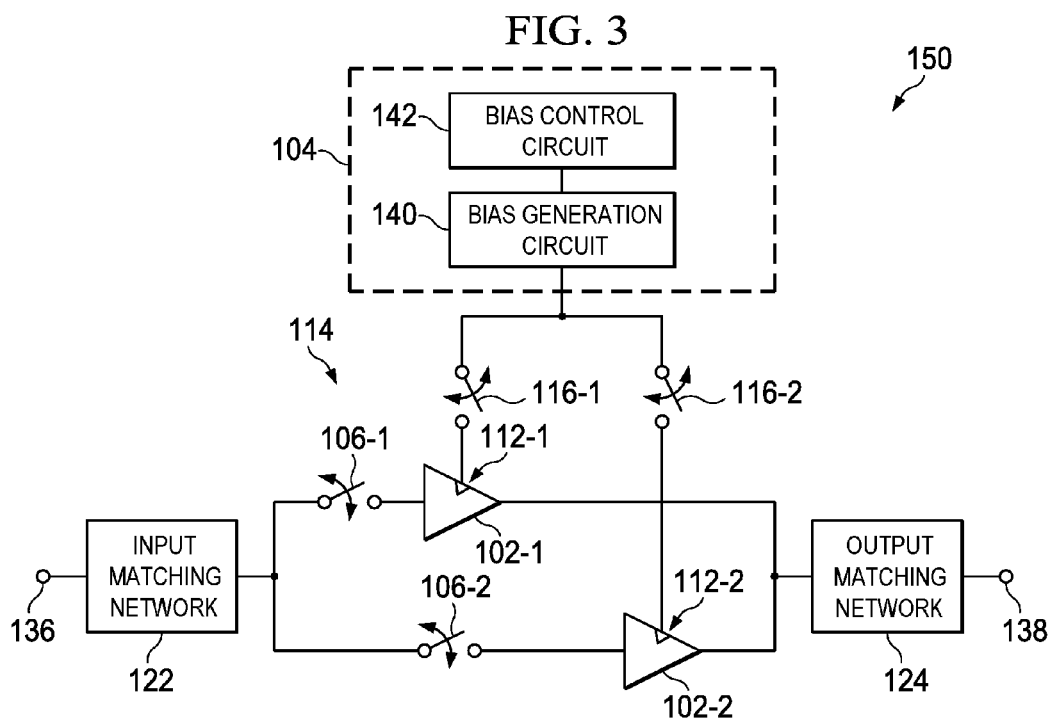
FIGS. 3-6 are schematic illustrations of various example embodiments of the switched amplifier of FIG. 1.

FIG. 3 depicts a switched amplifier 150 in which the switch arrangement 114 includes switches 106 to selectively couple the input matching network 102 to different ones of the amplifiers 102, and switches 116 to selectively couple the bias generation circuit 140 to different ones of the amplifiers 102 (to deliver bias currents to the corresponding bias inputs 112). Although two amplifiers 102 are illustrated in FIG. 3, more amplifiers 102 may be analogously included, as desired. As discussed above, the switches 106 and 116 of the switch arrangement 114 may be controlled by the bias control circuit 142; signaling pathways for this control are not shown for ease of illustration. In the embodiment of FIG. 3, the outputs of the amplifiers 102 are "permanently" coupled to the output matching network 124.

The embodiment of FIG. 3 may be used to "alternate" between the amplifier 102-1 and the amplifier 102-2. As discussed above, the amplifier 102-1 may be sized for proper operation at a low bias current, and the amplifier 102-2 may be sized for proper operation at a higher bias current. For example, the amplifier 102-2 may be sized for proper operation at a nominal bias current (corresponding to a nominal-power mode), and the amplifier 102-1 may be sized for proper operation at a bias current that is 10-20% of the nominal bias current (corresponding to a low-power mode).

When the switched amplifier 150 of FIG. 3 is to operate in the nominal-power mode (e.g., as signaled to the bias control circuit 142), the bias control circuit 142 may cause the switch 116-2 to close to allow the bias generation circuit 140 to deliver bias current to the bias input 112-2, and the bias control circuit 142 may cause the switch 106-2 to close to include the amplifier 102-2 in the signaling pathway between the input terminal 136 and the output terminal 138 (and in particular, to allow an input provided to the input terminal 136 to pass to the input of the amplifier 102-2). The bias control circuit 142 may also cause the switches 106-1 and 116-1 to open, and the bias generation circuit 140 to provide the appropriate nominal bias current to the amplifier 102-2.

When the switched amplifier 150 of FIG. 3 is to operate in the low-power mode (e.g., as signaled to the bias control circuit 142), the bias control circuit 142 may cause the switch 116-1 to close to allow the bias generation circuit 140 to deliver bias current to the bias input 112-1, and the bias control circuit 142 may cause the switch 106-1 to close to include the amplifier 102-1 in the signaling pathway between the input terminal 136 and the output terminal 138 (and in particular, to allow an input provided to the input terminal 136 to pass to the input of the amplifier 102-1). The bias control circuit 142 may also cause the switches 106-2 and 116-2 to open, and the bias generation circuit 140 to provide the appropriate low bias current to the amplifier 102-1. Accordingly, the power consumption of the switched amplifier 150 in the low-power mode may be less than the power consumption of the switched amplifier 150 in the nominal-power mode.

Figure 4:
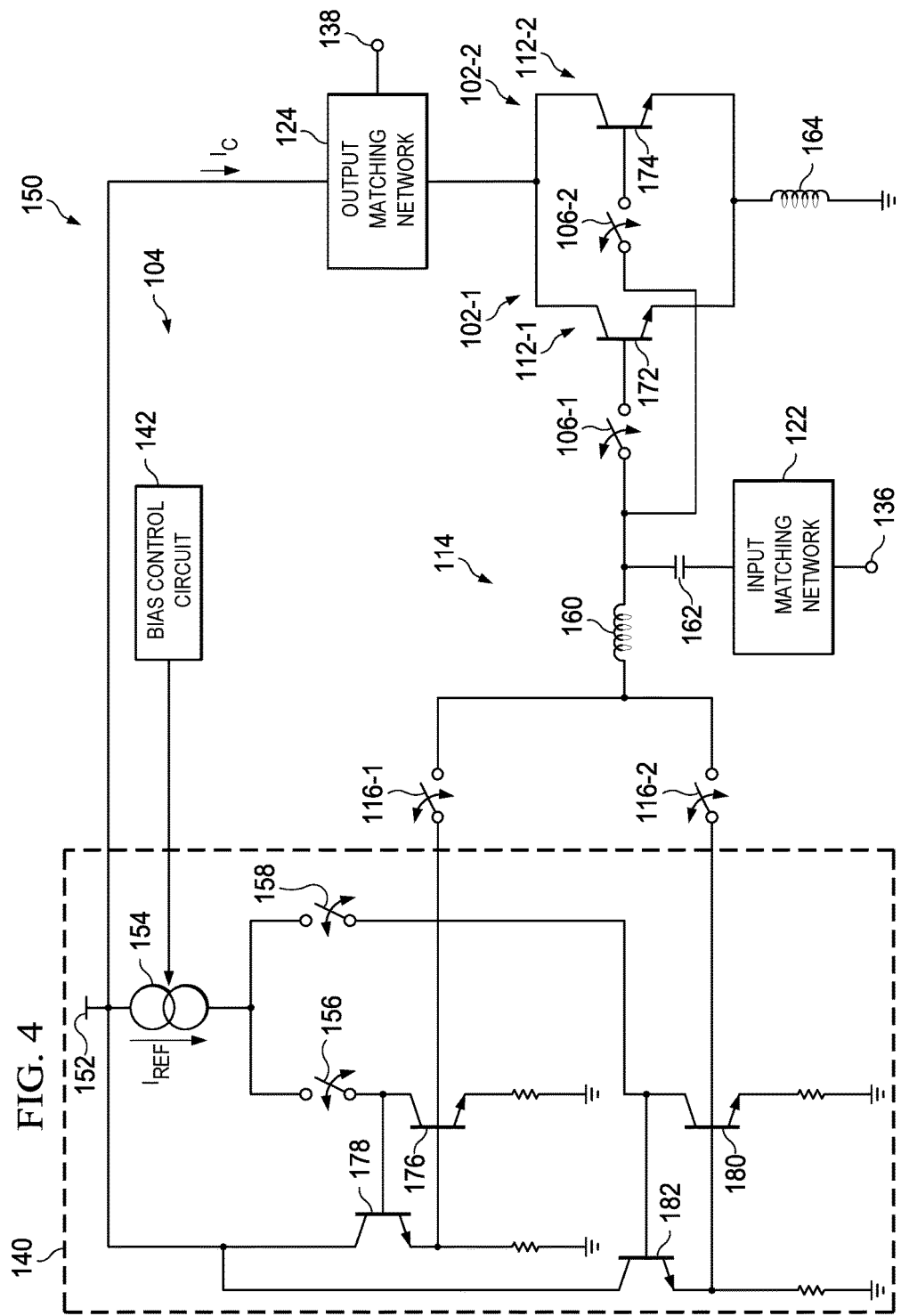

FIG. 4 depicts an embodiment of the switched amplifier 150 of FIG. 3. As noted above with reference to FIG. 3, although two amplifiers 102 are illustrated in FIG. 4, more amplifiers 102 may be analogously included, as desired. As discussed above, the switches 106 and 116 of the switch arrangement 114 may be controlled by the bias control circuit 142; signaling pathways for this control are not shown for ease of illustration.

In FIG. 4, the amplifier 102-1 may include the transistor 172, and the amplifier 102-2 may include the transistor 174. The transistors illustrated in FIG. 4 are bipolar junction transistors (BJTs). The transistors 172 and 174 may be arranged in a common emitter configuration, as shown. The switches 106-1 and 106-2 may be closed in an exclusive OR fashion to include the transistors 172 and 174, respectively, in the signaling pathway between the input terminal 136 and the output terminal 138. The bias generation circuit 140 may include a reference voltage 152 to which a reference current source 154 is coupled (generating a current $I_{REF}$). Reliability switches 156 and 158 may be coupled between the reference current source 154 and current mirror transistors 176 and 180, respectively. The reliability switches 156 and 158, when off, may help keep the corresponding current mirror transistors 176 and 180 from going into saturation mode (at which point their behavior may be non-ideal). The bias generation circuit 140 may further include beta helper transistors 178 and 182, which may help isolate the collectors and bases of the corresponding current mirror transistors 176 and 180.

The switched amplifier 150 of FIG. 4 may include an AC isolation inductor 160 to improve the AC isolation between the bias generation circuit 140 and the amplifiers 102-1 and 102-2, and a DC isolation capacitor 162 to improve the DC isolation between the bulk of the switched amplifier 150 and the input terminal 136. A degeneration inductor 164 may be coupled to the emitters of the transistors 172 and 174 to degenerate the amplifiers 102-1 and 102-2 to improve linearity (at the cost of gain).

As discussed above with reference to FIG. 3, the embodiment of FIG. 4 may be used to "alternate" between the amplifier 102-2 (sized for proper operation at a nominal bias current corresponding to a nominal-power mode) and the amplifier 102-1 (sized for proper operation at a bias current that is 10-20% of the nominal bias current, corresponding to a low-power mode). In the embodiment of FIG. 4, the size of the transistor 172 may be less than the size of the transistor 174.

When the switched amplifier 150 of FIG. 4 is to operate in the nominal-power mode (e.g., as signaled to the bias control circuit 142), the bias control circuit 142 may cause the switches 116-2 and 158 to close to allow the bias generation circuit 140 to deliver bias current to the bias input 112-2, and the bias control circuit 142 may cause the switch 106-2 to close to include the amplifier 102-2 in the signaling pathway between the input terminal 136 and the output terminal 138. The bias control circuit 142 may also cause the switches 106-1, 116-1, and 156 to open. If the size of the current mirror transistor 180 is Q2, and the size of the transistor 174 is m*Q2, the total current in the switched amplifier 150 in the nominal-power mode will be approximately $(m+1)*I_{REF}$, with $m*I_{REF}$ of that current provided as the bias current for the amplifier 102-2. The current $m*I_{REF}$ may be selected to achieve the peak unity current gain frequency of the amplifier 102-2, which may optimize its performance for the given power consumption. The value of m may be selected with a view to limiting the total current consumption of the switched amplifier 150.

When the switched amplifier 150 of FIG. 4 is to operate in the low-power mode (e.g., as signaled to the bias control circuit 142), the bias control circuit 142 may cause the switches 116-1 and 156 to close to allow the bias generation circuit 140 to deliver bias current to the bias input 112-1, and the bias control circuit 142 may cause the switch 106-1 to close to include the amplifier 102-1 in the signaling pathway between the input terminal 136 and the output terminal 138. The bias control circuit 142 may also cause the switches 106-2, 116-2, and 158 to open. If the size of the current mirror transistor 176 is Q1, and the size of the transistor 172 is n*Q1, the total current in the switched amplifier 150 in low-power mode will be approximately $(n+1)*I_{REF}$, with $n*I_{REF}$ of that current provided as the bias current for the amplifier 102-1. The current $n*I_{REF}$ may be selected to be the peak unity gain current frequency current of the amplifier 102-1, which may optimize its performance for the given power consumption. The size n*Q1 of the transistor 172 may be selected to be less than the size m*Q2 of the transistor 174, as discussed above, and the value of n may be selected with a view to limiting the total current consumption of the switched amplifier 150. The value of n may be less than the value of m so that the total current consumption of the switched amplifier 150 in the low-power mode is less than the current consumption in the nominal-power mode. In some embodiments, the ratio m/n may be increased to reduce the power consumption in the low-power mode while operating in the nominal-power mode at peak performance.

Figure 5:
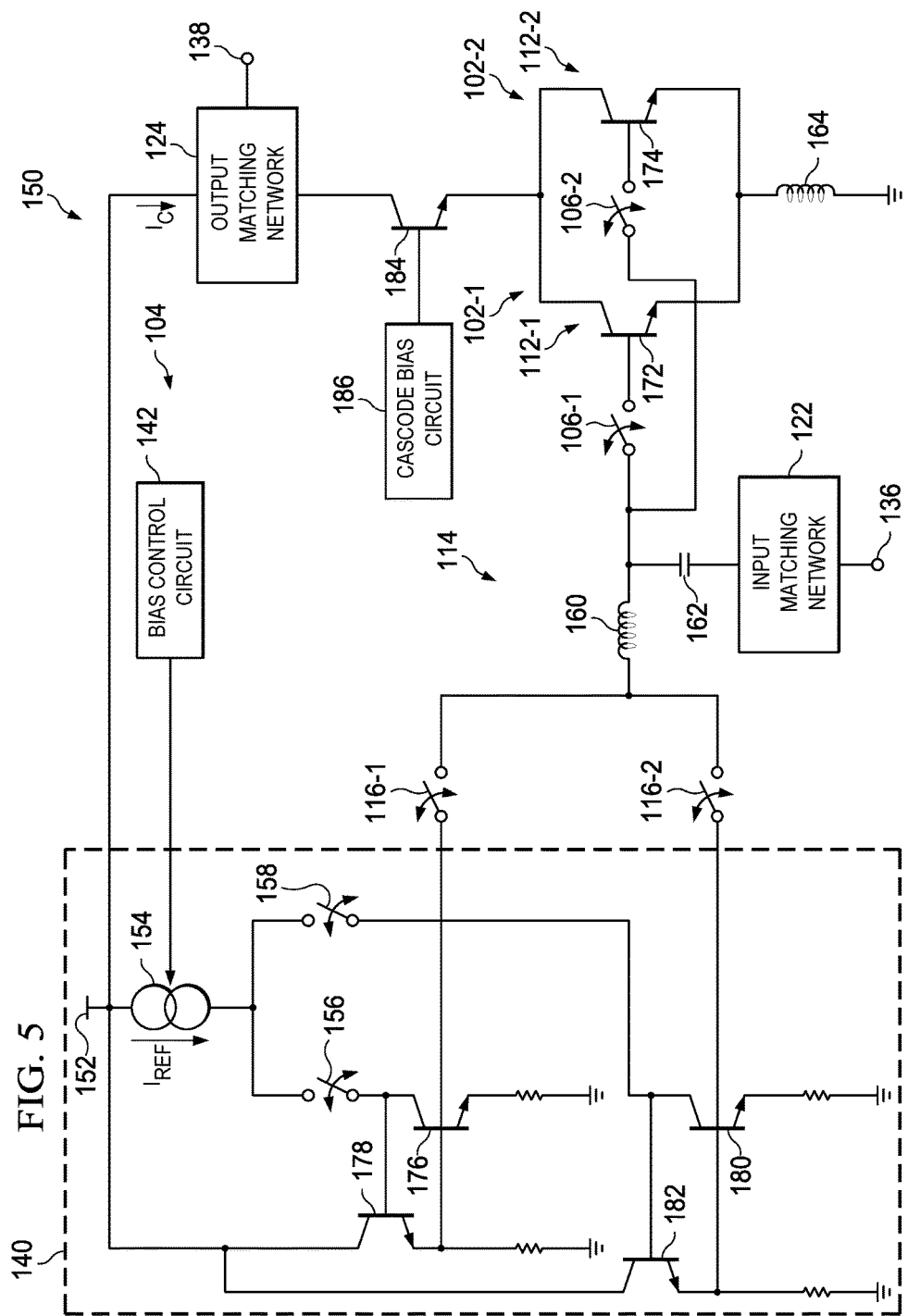

FIG. 5 depicts an embodiment of the switched amplifier 150 of FIG. 3 that has a substantially similar structure to the embodiment of FIG. 4, but that also includes a cascode transistor 184 (disposed between the output matching network 124 and the amplifiers 102-1 and 102-2) and an accompanying cascode bias circuit 186. The cascode transistor 184 may be arranged in a common-based configuration, as shown, and may aid in providing a stable output impedance when the switched amplifier 150 is switch between the low and nominal-power mode (or, more generally, when different ones of the amplifiers 102 are switched into the signaling pathway between the input terminal 136 and the output terminal 138). Inclusion of the cascode transistor 184 may ease the design of the output matching network 124, and may provide higher gain than the common-emitter arrangement of the amplifiers 102-1 and 102-2 (due to the higher output impedance). The cost of the inclusion of the cascode transistor 184 may be a higher voltage headroom, resulting in a reduction in the allowable voltage swing at the output for the same value of the reference voltage 152. The cascode bias circuit 186 may take any suitable form known in the art (e.g., including diodes), and may utilize current from the reference current source 154.

Figure 6:
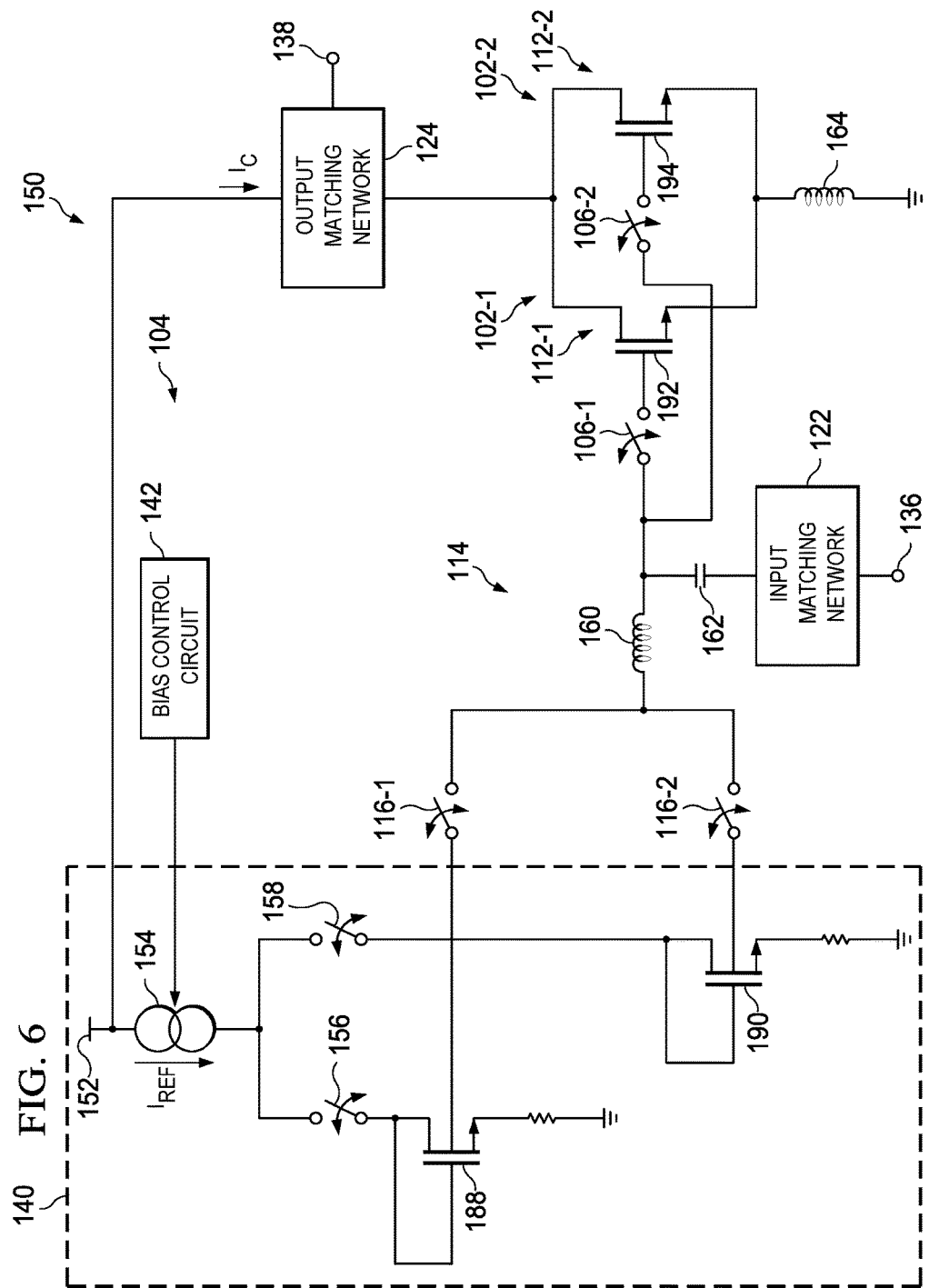

FIG. 6 depicts an embodiment of the switched amplifier 150 of FIG. 3 that is substantially similar to the embodiment of FIG. 4, but includes complementary metal oxide semiconductor (CMOS) transistors instead of BJTs. Elements common to the embodiment of FIGS. 4 and 6 are discussed above with reference to FIG. 4. As noted above with reference to FIG. 3, although two amplifiers 102 are illustrated in FIG. 6, more amplifiers 102 may be analogously included, as desired. As discussed above, the switches 106 and 116 of the switch arrangement 114 may be controlled by the bias control circuit 142; signaling pathways for this control are not shown for ease of illustration.

In FIG. 4, the amplifier 102-1 may include the transistor 192, and the amplifier 102-2 may include the transistor 194. The transistors illustrated in FIG. 6 are CMOS transistors (e.g., metal oxide semiconductor field-effect transistors (MOSFETs)), as noted above. The transistors 192 and 194 may be arranged in a common source configuration, as shown. The switches 106-1 and 106-2 may be closed in an exclusive OR fashion to include the transistors 192 and 194, respectively, in the signaling pathway between the input terminal 136 and the output terminal 138. Reliability switches 156 and 158 may be coupled between the reference current source 154 and current mirror transistors 188 and 190, respectively. Switches 156 and 116-1 may be on while switches 158 and 116-2 are off, and vice versa.

As discussed above with reference to FIG. 3, the embodiment of FIG. 4 may be used to "alternate" between the amplifier 102-2 (sized for proper operation at a nominal bias current corresponding to a nominal-power mode), and the amplifier 102-1 (sized for proper operation at a bias current that is 10-20% of the nominal bias current, corresponding to a low-power mode). In the embodiment of FIG. 6, the size of the transistor 192 may be less than the size of the transistor 194.

When the switched amplifier 150 of FIG. 6 is to operate in the nominal-power mode (e.g., as signaled to the bias control circuit 142), the bias control circuit 142 may cause the switches 116-2 and 158 to close to allow the bias generation circuit 140 to deliver bias current to the bias input 112-2, and the bias control circuit 142 may cause the switch 106-2 to close to include the amplifier 102-2 in the signaling pathway between the input terminal 136 and the output terminal 138. The bias control circuit 142 may also cause the switches 106-1, 116-1, and 156 to open. If the size of the current mirror transistor 190 is M2, and the size of the transistor 194 is m*M2, the total current in the switched amplifier 150 in the nominal-power mode will be approximately (m+1)*$I_{REF}$, with m*$I_{REF}$ of that current provided as the bias current for the amplifier 102-2. The current m*$I_{REF}$ may be selected to be the peak unity gain current frequency current of the amplifier 102-2, which may optimize its performance for the given power consumption. The value of m may be selected with a view to limiting the total current consumption of the switched amplifier 150.

When the switched amplifier 150 of FIG. 6 is to operate in the low-power mode (e.g., as signaled to the bias control circuit 142), the bias control circuit 142 may cause the switches 116-1 and 156 to close to allow the bias generation circuit 140 to deliver bias current to the bias input 112-1, and the bias control circuit 142 may cause the switch 106-1 to close to include the amplifier 102-1 in the signaling pathway between the input terminal 136 and the output terminal 138. The bias control circuit 142 may also cause the switches 106-2, 116-2, and 158 to open. If the size of the current mirror transistor 188 is M1, and the size of the transistor 192 is n*M1, the total current in the switched amplifier 150 in low-power mode will be approximately (n+1)*$I_{REF}$, with n*$I_{REF}$ of that current provided as the bias current for the amplifier 102-1. The current n*$I_{REF}$ may be selected to be the peak unity gain current frequency current of the amplifier 102-1, which may optimize its performance for the given power consumption. The size n*M1 of the transistor 192 may be selected to be less than the size m*M2 of the transistor 194, as discussed above, and the value of n may be selected with a view to limiting the total current consumption of the switched amplifier 150. The value of n may be less than the value of m so that the total current consumption of the switched amplifier 150 in the low-power mode is less than the current consumption in the nominal-power mode. In some embodiments, the ratio m/n may be increased to reduce the power consumption in the low-power mode while operating in the nominal-power mode at peak performance.

Figure 7:
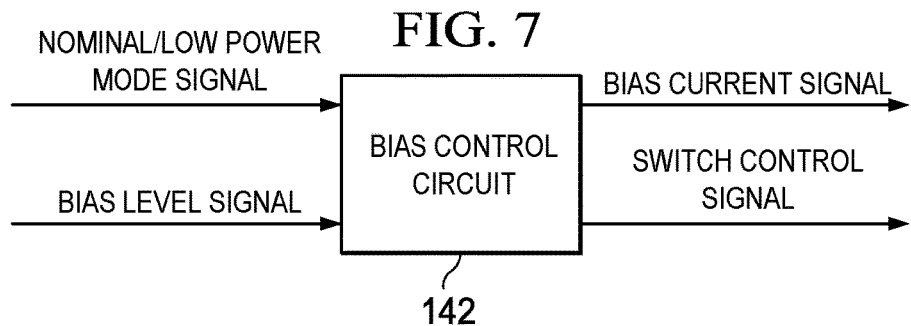
FIG. 7 is a block diagram of various inputs and outputs of an example bias control circuit of the switched amplifier of FIG. 1, in accordance with various embodiments.

As discussed above with reference to FIG. 1, in some embodiments, the bias control circuit 142 may be configured to receive a signal representative of a desired power mode and/or bias level, determine an amount of bias current to be provided based on the received signal, and provide a signal indicative of that bias current to the bias generation circuit 140. FIG. 7 is a block diagram of various inputs and outputs of an example bias control circuit 142 of the switched amplifier 150 of FIG. 1, in accordance with various embodiments. In the embodiment of FIG. 7, the bias control circuit 142 may receive, as inputs, a nominal-/low-power mode signal and a bias level signal. The nominal-/low-power mode signal and/or the bias level signal may be provided by an operator (e.g., through a keyboard, touchscreen, or dial), or may be provided by another device in a larger system (e.g., a power management device). The nominal-/low-power mode signal may be an analog or digital signal indicating whether the switched amplifier 150 is to operate in a nominal-power mode or in a low-power mode. For embodiments in which the switched amplifier 150 can accommodate more than two power modes (e.g., three or more power modes), the nominal-/low-power mode signal may indicate which of the more than two power modes is the power mode in which the switched amplifier 150 is to operate (e.g., using a multiple bit digital signal or an analog signal with three or more valid values).

Figure 8:
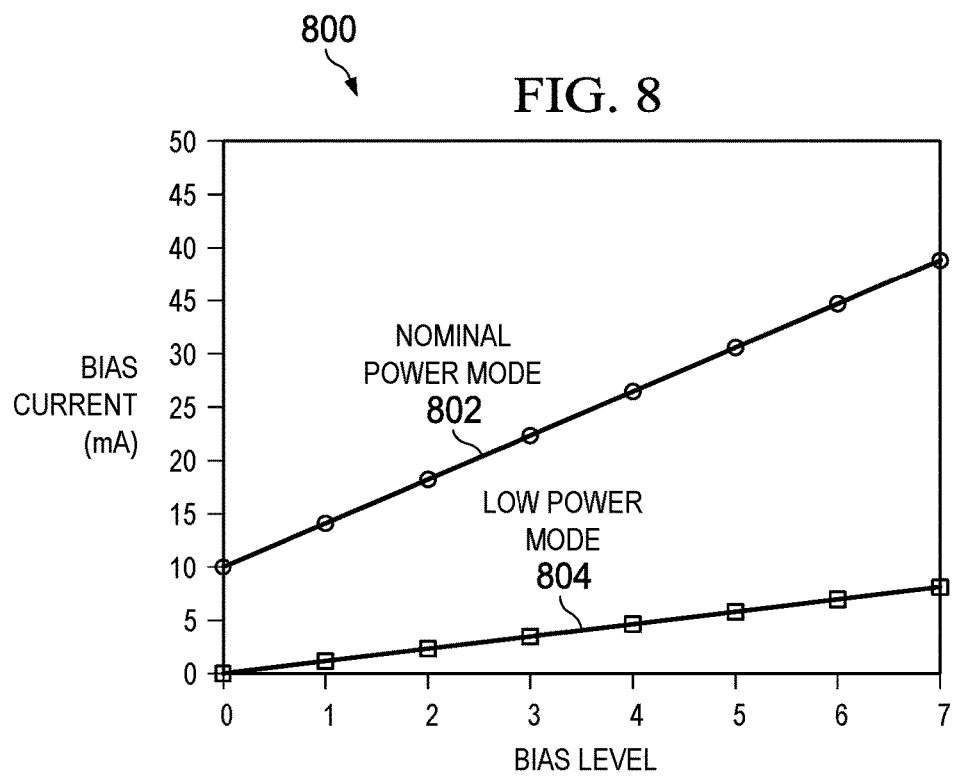
FIG. 8 is a plot depicting example bias current versus bias level curves for nominal and low-power modes of the switched amplifier of FIG. 1, in accordance with various embodiments.

The bias level signal may be an analog or digital signal that indicates what the bias current should be within a range of possible bias currents corresponding to the selected power mode. For example, FIG. 8 is a plot 800 depicting example bias current versus bias level curves 802 and 804 for nominal- and low-power modes of the switched amplifier 150 of FIG. 1, respectively, in accordance with various embodiments. When the switched amplifier 150 is in the low-power mode (curve 804), the bias generation circuit 140 may provide a bias current (to the appropriate amplifier 102) that is selected from a range of possible bias currents (approximately 0 mA to approximately 9 mA in FIG. 8). The bias level signal provided to the bias control circuit 142 may indicate the desired bias current in the corresponding range. For example, FIG. 8 depicts an embodiment in which there are eight possible bias levels (0-7, which may be communicated using a 3-bit digital value) corresponding to different bias currents within the 0-9 mA range associated with the low-power mode. When the switched amplifier 150 is in the nominal power mode (curve 802), the bias generation circuit 140 may provide a bias current (to the appropriate amplifier 102) that is selected from a range of possible bias currents (approximately 9 mA to approximately 40 mA in FIG. 8). The bias level signal provided to the bias control circuit 142 may indicate the desired bias current in the corresponding range. For example, the eight possible bias levels of FIG. 8 correspond to different bias currents within the 9-40 mA range associated with the nominal-power mode. In some embodiments, the bias level may be the point within the available bias current range at which the "selected" amplifier 102 operates closest to optimally; this point may be determined during manufacturing or automatically determined during operation, for example. The particular amounts of the bias currents, the particular ranges for the different power modes, and the particular number of bias levels illustrated in FIG. 8 are simply illustrative, and any suitable values may be used.

As illustrated in FIG. 7, the bias control circuit 142 may output a bias current signal and/or a switch control signal. The bias current signal may be provided to the bias generation circuit 140 and may indicate an amount of bias current to be provided by the bias generation circuit 140 to the amplifier 102. The switch control signal may be provided to the switch arrangement 104 and may indicate which of the switches in the switch arrangement 114 should be opened and/or closed to facilitate the desired configuration within the switched amplifier 150, as discussed above. In some embodiments, the switch control signal may include multiple signals for each of multiple switches included in the switch arrangement 114, with the multiple signals to open or close corresponding ones of the multiple switches.

Figure 9:
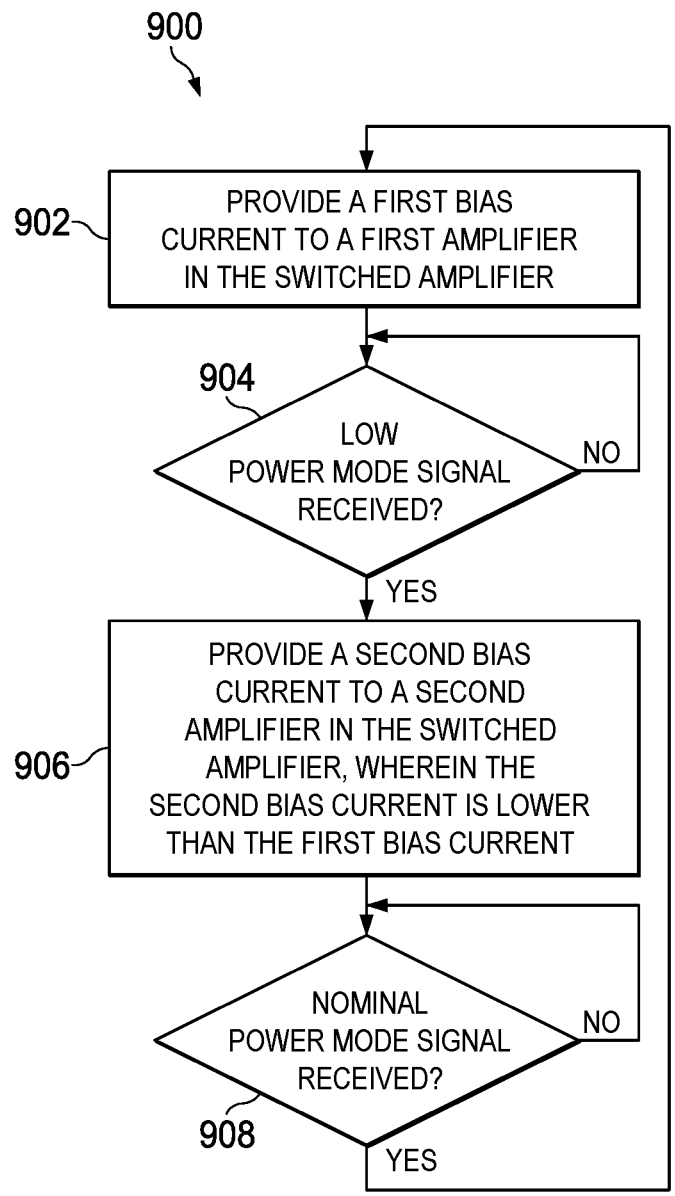
FIG. 9 is a flow diagram of a method of operating a switched amplifier, in accordance with various embodiments.

FIG. 9 is a flow diagram of a method 900 of operating a switched amplifier, in accordance with various embodiments. Operations discussed below with reference to the method 900 may be illustrated with reference to the switched amplifier 150 of FIG. 1, but this is simply for ease of discussion, and the method 900 may be used to operate any suitable switched amplifier. Although the method 900 discusses an embodiment having two power modes, the method may include three or more power modes, as desired.

At 902, a first bias current may be provided to a first amplifier in the switched amplifier. The first bias current may be, for example, a nominal bias current, and may be provided by the bias circuit 104 (e.g., the bias generation circuit 140) to the amplifier 102-2 (which may be designed to operate at near peak performance with the nominal bias current). In some embodiments, one or more switches in the switch arrangement 114 may be opened and/or closed to facilitate the provision of the first bias current to the first amplifier at 902. In some embodiments, one or more switches in the switch arrangement 114 may be opened and/or closed to include the first amplifier in a signaling pathway between an input and an output of the switched amplifier (via the input matching network 122 and the output matching network 124).

At 904, a determination may be made as to whether a low-power mode signal has been received. In some embodiments, the bias circuit 104 (e.g., the bias control circuit 142) may perform the determination at 904. The low-power mode signal may take any suitable form, such as any of the forms discussed above with reference to FIGS. 7 and 8. If it is determined at 904 that no low-power mode signal has been received, monitoring for the low-power mode signal may continue.

If it is determined at 904 that a low-power mode signal has been received, the method 900 may proceed to 906, and a second bias current, lower than the first bias current, may be provided to a second amplifier in the switched amplifier. The second bias current may be, for example, a low bias current and may be provided by the bias circuit 104 (e.g., the bias generation circuit 140) to the amplifier 102-1 (which may be designed operate at near peak performance with the low bias current). In some embodiments, one or more switches and switch arrangement 114 may be opened and/or closed to facilitate the provision of the second bias current to the second amplifier at 906. In some embodiments, one or more switches in the switch arrangement 114 may be opened and/or closed to include the second amplifier in a signaling pathway between an input and an output of the switched amplifier (via the input matching network 122 and the output matching network 124); the first amplifier of 902 may be excluded from the signaling pathway.

At 908, a determination may be made as to whether a nominal-power mode signal has been received. In some embodiments, the bias circuit 104 (e.g., the bias control circuit 142) may perform the determination at 908. The nominal power mode signal may take any suitable form, such as any of the forms discussed above with reference to FIGS. 7 and 8. If it is determined at 908 that no nominal-power mode signal has been received, monitoring for the nominal-power mode signal may continue. If it is determined at 908 that a nominal power mode signal has been received, the method 900 may return to 902, and the first bias current may be provided to the first amplifier in the switched amplifier.

In some embodiments, different ones of the multiple amplifiers 102 included in a switched amplifier 150 may be wholly separate, while in other embodiments, two or more different ones of the multiple amplifiers 102 may share components. For example, if the amplifier 102-1 includes a single transistor, and the amplifier 102-2 includes three parallel transistors, the three parallel transistors of the amplifier 102-2 may include the single transistor of the amplifier 102-1. More generally, different ones of multiple amplifiers 102 may share resources (e.g., a pool of transistors), and may be distinguished from one another by which of these resources are used (and how they are used) by the different amplifiers 102. In some embodiments, the switch arrangement 114 may include one or more switches to allow different resources in a shared set (e.g., a shared set of transistor) to be opened and closed to achieve a desired configuration for each of the amplifiers 102. In some embodiments, the resources shared between different ones of the multiple amplifiers 102 may include transistors having different sizes (enabling the multiple amplifiers 102 to achieve different gains). In one such example, the different sizes may be related by powers of two (e.g., one, two, four, eight, sixteen, etc.), and different ones of the transistors may be switched, in any desired combination, in and out of the signaling pathway between the input terminal 136 and the output terminal 138.

Figure 10:
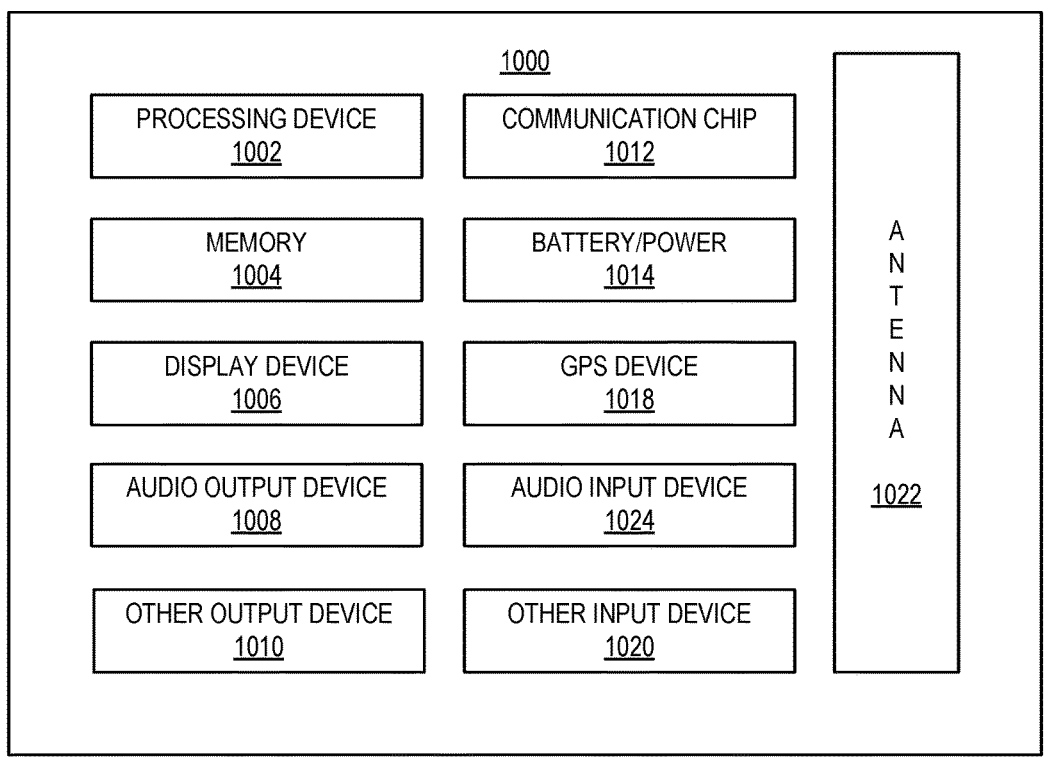
FIG. 10 is a block diagram of a computing device that may include the switched amplifier of FIG. 1, in accordance with various embodiments.

The embodiments disclosed herein may be included in any suitable device, such as any suitable computing device. For example, FIG. 10 is a block diagram of a computing device that may include any of the embodiments of the switched amplifier 150 of FIG. 1, in accordance with the teachings of the present disclosure. In particular, any of the components of the computing device 1000 that may benefit from amplification in multiple power modes may advantageously include the switched amplifier 150. A number of components are illustrated in FIG. 10 as included in the computing device 1000, but any one or more of these components may be omitted or duplicated, as suitable for the application. In some embodiments, some or all of these components are fabricated onto a single system-on-a-chip (SoC) die.

Additionally, in various embodiments, the computing device 1000 may not include one or more of the components illustrated in FIG. 10, but the computing device 1000 may include interface circuitry for coupling to the one or more components. For example, the computing device 1000 may not include a display device 1006, but may include display device interface circuitry (e.g., a connector and driver circuitry) to which a display device 1006 may be coupled. In another set of examples, the computing device 1000 may not include an audio input device 1024 or an audio output device 1008, but may include audio input or output device interface circuitry (e.g., connectors and supporting circuitry) to which an audio input device 1024 or audio output device 1008 may be coupled. Any one or more of the components of the computing device 1000 may include one or more switched amplifiers 150.

The computing device 1000 may include a processing device 1002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 1002 may include a switched amplifier 150. The computing device 1000 may include a memory 1004, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 1004 may include memory that shares a die with the processing device 1002. This memory may be used as cache memory and may include embedded DRAM (eDRAM) or spin transfer torque magnetic RAM (STT-M RAM).

In some embodiments, the computing device 1000 may include a communication chip 1012 (e.g., one or more communication chips). For example, the communication chip 1012 may be configured for managing wireless communications for the transfer of data to and from the computing device 1000. The term "wireless" and its derivatives may be used to describe circuits, devices, systems, methods, techniques, communication channels, etc., that may communicate data through the use of modulated electromagnetic radiation through a nonsolid medium. The term does not imply that the associated devices do not contain any wires, although in some embodiments they might not. The communication chip 1012 may include a switched amplifier 150.

The communication chip 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1012 may operate in accordance with other wireless protocols in other embodiments. The computing device 1000 may include an antenna 1022 to facilitate wireless communications and/or to receive other wireless communications (such as AM or FM radio transmissions).

In some embodiments, the communication chip 1012 may manage wired communications, such as electrical, optical, or any other suitable communication protocols (e.g., the Ethernet). As noted above, the communication chip 1012 may include multiple communication chips. For instance, a first communication chip 1012 may be dedicated to shorter-range wireless communications such as Wi-Fi or Bluetooth, and a second communication chip 1012 may be dedicated to longer-range wireless communications such as a global positioning system (GPS), EDGE, GPRS, CDMA, WiMAX, LTE, EV-DO, or others. In some embodiments, a first communication chip 1012 may be dedicated to wireless communications, and a second communication chip 1012 may be dedicated to wired communications.

The computing device 1000 may include battery/power circuitry 1014. The battery/power circuitry 1014 may include one or more energy storage devices (e.g., batteries or capacitors) and/or circuitry for coupling components of the computing device 1000 to an energy source separate from the computing device 1000 (e.g., AC line power). The battery/power circuitry 1014 may include a switched amplifier 150.

The computing device 1000 may include a display device 1006 (or corresponding interface circuitry, as discussed above). The display device 1006 may include any visual indicators, such as a heads-up display, a computer monitor, a projector, a touchscreen display, a liquid crystal display (LCD), a light-emitting diode display, or a flat panel display, for example.

The computing device 1000 may include an audio output device 1008 (or corresponding interface circuitry, as discussed above). The audio output device 1008 may include any device that generates an audible indicator, such as speakers, headsets, or earbuds, for example.

The computing device 1000 may include an audio input device 1024 (or corresponding interface circuitry, as discussed above). The audio input device 1024 may include any device that generates a signal representative of a sound, such as microphones, microphone arrays, or digital instruments (e.g., instruments having a musical instrument digital interface (MIDI) output).

The computing device 1000 may include a global positioning system (GPS) device 1018 (or corresponding interface circuitry, as discussed above). The GPS device 1018 may be in communication with a satellite-based system and may receive a location of the computing device 1000, as known in the art. The GPS device 1018 may include a switched amplifier 150.

The computing device 1000 may include an other output device 1010 (or corresponding interface circuitry, as discussed above). Examples of the other output device 1010 may include an audio codec, a video codec, a printer, a wired or wireless transmitter for providing information to other devices, or an additional storage device.

The computing device 1000 may include an other input device 1020 (or corresponding interface circuitry, as discussed above). Examples of the other input device 1020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1000 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1000 may be any other electronic device that processes data.

The following paragraphs provide various examples of the embodiments disclosed herein.

Example 1 is a switched amplifier, including: a first amplifier; a second amplifier; an input matching network common to both the first and second amplifiers; and at least one switch to couple an input of the switched amplifier, via the input matching network, to one of the first amplifier or the second amplifier.

Example 2 may include the subject matter of Example 1, and may further include a bias generation circuit to provide a first bias current to the first amplifier when the input is coupled to the first amplifier via the input matching network, and to provide a second bias current to the second amplifier when the input is coupled to the second amplifier via the input matching network, wherein the second bias current is less than the first bias current.

Example 3 may include the subject matter of Example 2, and may further include a bias control circuit to: receive a low-power mode signal; and in response to receipt of the low-power mode signal, cause the bias generation circuit to generate the second bias current.

Example 4 may include the subject matter of Example 3, and may further specify that the bias control circuit is further to, in response to receipt of the low-power mode signal, cause the at least one switch to couple the input, via the input matching network, to the second amplifier.

Example 5 may include the subject matter of any of Examples 3-4, and may further specify that the bias control circuit is further to: receive a nominal-power mode signal; and in response to receipt of the nominal-power mode signal, cause the bias generation circuit to generate the first bias current.

Example 6 may include the subject matter of Example 5, and may further specify that the bias control circuit is further to, in response to receipt of the nominal-power mode signal, cause the at least one switch to couple the input, via the input matching network, to the first amplifier.

Example 7 may include the subject matter of any of Examples 5-6, and may further specify that the bias control circuit is further to: receive a bias level signal; in response to receipt of the nominal-power mode signal and the bias level signal, identify a current value corresponding to the bias level signal within a nominal-power mode current range; and cause the bias generation circuit to generate the first bias current, wherein the first bias current has the current value.

Example 8 may include the subject matter of any of Examples 3-7, and may further specify that the bias control circuit is further to: receive a bias level signal; in response to receipt of the low-power mode signal and the bias level signal, identify a current value corresponding to the bias level signal within a low-power mode current range; and cause the bias generation circuit to generate the second bias current, wherein the second bias current has the current value.

Example 9 may include the subject matter of any of Examples 1-8, and may further include an output matching network common to both the first and second amplifiers.

Example 10 may include the subject matter of Example 9, and may further include at least one switch to couple an output of the switched amplifier, via the output matching network, to one of the first amplifier or the second amplifier.

Example 11 may include the subject matter of any of Examples 1-10, and may further specify that the first and second amplifiers are transconductance amplifiers.

Example 12 may include the subject matter of any of Examples 1-11, and may further include a third amplifier; wherein the input matching network is common to the first, second, and third amplifiers, and the at least one switch is to couple the input, via the input matching network, to one of the first amplifier, the second amplifier, or the third amplifier.

Example 13 may include the subject matter of any of Examples 1-12, and may further specify that the first amplifier includes a first bipolar junction transistor (BJT) and the second amplifier includes a second BJT.

Example 14 may include the subject matter of Example 13, and may further include a bias generation circuit including a pair of current mirror BJTs.

Example 15 may include the subject matter of Example 14, and may further specify that the bias generation circuit further includes a pair of beta helper BJTs.

Example 16 may include the subject matter of any of Examples 13-15, and may further specify that the first amplifier has a cascode topology.

Example 17 may include the subject matter of any of Examples 13-16, and may further specify that the first and second BJTs are arranged in a common emitter configuration.

Example 18 may include the subject matter of any of Examples 1-17, and may further specify that the first amplifier includes a first metal oxide semiconductor field effect transistor (MOSFET) and the second amplifier includes a second MOSFET.

Example 19 is a switched amplifier system, including: a switched amplifier, including a first amplifier; a second amplifier; an input matching network common to both the first and second amplifiers, or an output matching network common to both the first and second amplifiers; and a bias circuit to selectively (1) provide a first bias current to the first amplifier or (2) provide a second bias current to the second amplifier, wherein the second bias current is less than the first bias current.

Example 20 may include the subject matter of Example 19, and may further specify that the bias circuit is to: receive a low-power mode signal; and in response to receipt of the low-power mode signal, provide the second bias current.

Example 21 may include the subject matter of Example 20, and may further include at least one switch that, in response to the low-power mode signal, is to (1) couple an input of the switched amplifier system, via the input matching network, to the second amplifier or (2) couple an output of the switched amplifier system, via the output matching network, to the second amplifier.

Example 22 may include the subject matter of any of Examples 20-21, and may further specify that the bias circuit is further to: receive a nominal-power mode signal; and in response to receipt of the nominal-power mode signal, provide the first bias current.

Example 23 may include the subject matter of any of Examples 19-22, and may further specify that the first and second amplifiers are transconductance amplifiers.

Example 24 may include the subject matter of any of Examples 19-23, and may further specify that the bias circuit includes a pair of current mirror bipolar junction transistors (BJTs).

Example 25 may include the subject matter of any of Examples 19-24, and may further specify that the first amplifier has a cascode topology.

Example 26 may include the subject matter of any of Examples 19-25, and may further specify that the first amplifier includes a first metal oxide semiconductor field effect transistor (MOSFET) and the second amplifier includes a second MOSFET.

Example 27 may include the subject matter of any of Examples 19-26, and may further include a radio frequency (RF) signal source coupled to an input of the switched amplifier.

Example 28 is a method of operating a switched amplifier with adjustable power consumption, including: providing a first bias current to a first amplifier in the switched amplifier; receiving a low-power mode signal; and in response to receiving the low-power mode signal, providing a second bias current to a second amplifier in the switched amplifier, wherein the second bias current is lower than the first bias current, and wherein the first and second amplifiers share an input matching network or an output matching network.

Example 29 may include the subject matter of Example 28, and may further include, in response to receiving the low-power mode signal, actuating one or more switches to couple an input of the switched amplifier to the second amplifier.

Example 30 may include the subject matter of any of Examples 28-29, and may further include: after providing the second bias current to the second amplifier, receiving a nominal-power mode signal;

in response to receiving the nominal-power mode signal, providing the first bias current to the first amplifier; and actuating one or more switches to couple an input of the switched amplifier to the first amplifier.

Example 31 may include the subject matter of any of Examples 28-30, and may further specify that the first and second amplifiers are transconductance amplifiers.

Example 32 may include the subject matter of any of Examples 28-31, and may further specify that the first and second amplifiers share the input matching network and the output matching network.

Example 33 is a computing device including any of the switched amplifiers disclosed herein.

Example 34 is an apparatus including means for performing any of the methods disclosed herein.

What is claimed is:

1. A switched amplifier, comprising:
   a first amplifier;
   a second amplifier;
   an input matching network common to both the first and second amplifiers;
   at least one switch to couple an input of the switched amplifier, via the input matching network, to one of the first amplifier or the second amplifier;
   a bias generation circuit to provide a first bias current to the first amplifier when the input is coupled to the first amplifier via the input matching network, and to provide a second bias current to the second amplifier when the input is coupled to the second amplifier via the input matching network, wherein the second bias current is less than the first bias current; and
   a bias control circuit to:
      receive a first power mode signal;
      receive a bias level signal;
      in response to receipt of the first power mode signal and the bias level signal, cause the bias generation circuit to generate the second bias current, wherein the second bias current has a current value corresponding to the bias level signal within a first power mode current range.

2. The switched amplifier of claim 1, wherein the bias control circuit is further to, in response to receipt of the first power mode signal, cause the at least one switch to couple the input, via the input matching network, to the second amplifier.

3. The switched amplifier of claim 1, wherein the bias control circuit is further to:
   receive a second power mode signal, wherein the second power mode signal is representative of a second power mode different from the first power mode; and
   at least partially in response to receipt of the second power mode signal, cause the bias generation circuit to generate the first bias current.

4. The switched amplifier of claim 3, wherein the bias control circuit is further to, in response to receipt of the second power mode signal, cause the at least one switch to couple the input, via the input matching network, to the first amplifier.

5. The switched amplifier of claim 3, wherein the bias level signal is a first bias level signal, and the bias control circuit is further to:
   receive a second bias level signal; and
   in response to receipt of the second power mode signal and the second bias level signal, cause the bias generation circuit to generate the first bias current, wherein the first bias current has a current value corresponding to the second bias level signal within a second power mode current range.

6. The switched amplifier of claim 1, further comprising:
   an output matching network common to both the first and second amplifiers.

7. The switched amplifier of claim 6, further comprising:
   at least one switch to couple an output of the switched amplifier, via the output matching network, to one of the first amplifier or the second amplifier.

8. The switched amplifier of claim 1, wherein the first and second amplifiers are transconductance amplifiers.

9. The switched amplifier of claim 1, further comprising:
   a third amplifier;
   wherein the input matching network is common to the first, second, and third amplifiers, and the at least one switch is to couple the input, via the input matching network, to one of the first amplifier, the second amplifier, or the third amplifier.

10. The switched amplifier of claim 1, wherein the first amplifier includes a first bipolar junction transistor (BJT) and the second amplifier includes a second BJT.

11. The switched amplifier of claim 10, further comprising:
a bias generation circuit including a pair of current mirror BJTs.

12. The switched amplifier of claim 11, wherein the bias generation circuit further includes a pair of beta helper BJTs.

13. The switched amplifier of claim 10, wherein the first amplifier has a cascode topology.

14. The switched amplifier of claim 10, wherein the first and second BJTs are arranged in a common emitter configuration.

15. The switched amplifier of claim 1, wherein the first amplifier includes a first metal oxide semiconductor field effect transistor (MOSFET) and the second amplifier includes a second MOSFET.

16. A switched amplifier system for improved gain performance, comprising:
a switched amplifier, including:
an input terminal;
an output terminal;
multiple amplifiers;
an input matching network coupled to the input terminal and common to the multiple amplifiers, or an output matching network coupled to the output terminal and common to the multiple amplifiers; and
a bias circuit to identify a value of a bias current for the switched amplifier, and to cause ones of the multiple amplifiers to be switched into or out of a signal pathway between the input terminal and the output terminal based on the identified value of the bias current.

17. The switched amplifier system of claim 16, further comprising:
a radio frequency (RF) signal source coupled to an input of the switched amplifier.

18. A method of operating a switched amplifier with adjustable power consumption, comprising:
providing a first bias current to a first amplifier in the switched amplifier;
receiving a first power mode signal and a bias level signal;

in response to receiving the first power mode signal, actuating one or more switches to couple an input of the switched amplifier to a second amplifier in the switched amplifier; and in response to receiving the first power mode signal and the bias level signal, providing a second bias current to the second amplifier, wherein the second bias current is lower than the first bias current, and the second bias current has a current value corresponding to the bias level signal within a first power mode current range.

19. The method of claim 18, further comprising:
after providing the second bias current to the second amplifier, receiving a second power mode signal;
in response to receiving the second power mode signal, providing the first bias current to the first amplifier; and
actuating one or more switches to couple an input of the switched amplifier to the first amplifier.

20. The switched amplifier system of claim 16, wherein the value of the bias current for the switched amplifier is based on a power consumption limit for the switched amplifier system.

21. The switched amplifier system of claim 16, wherein the bias circuit is to cause ones of the multiple amplifiers to be switched into or out of a signal pathway between the input terminal and the output terminal based on the identified value of the bias current to mitigate gain expansion.

22. The switched amplifier system of claim 16, wherein identify a value of a bias current for the switched amplifier includes identify a received power mode signal.

23. The switched amplifier system of claim 16, further comprising:
an input matching network coupled to the input terminal and common to the multiple amplifiers, or an output matching network coupled to the output terminal and common to the multiple amplifiers.

24. The switched amplifier of claim 1, wherein the switched amplifier does not include an additional matching network between the input and the first amplifier, or between the input and the second amplifier.

25. The method of claim 18, further comprising:
receiving a radio frequency (RF) signal from an RF signal source coupled to an input of the switched amplifier.

* * * * *